US 6,467,641 B1

United States Patent
Minogue

(10) Patent No.: US 6,467,641 B1
(45) Date of Patent: Oct. 22, 2002

(54) CONTAINER DEVICE WITH ADJUSTABLE VOLUME FOR IMMOBILIZING SOLDER SPHERES AND METHOD THEREOF

(75) Inventor: Gerard R. Minogue, Kinnelon, NJ (US)

(73) Assignee: Fry's Metals, Inc., Jersey City, NJ (US)

(*) Notice: Subject to any disclaimer, the term of this patent is extended or adjusted under 35 U.S.C. 154(b) by 0 days.

(21) Appl. No.: 09/638,820

(22) Filed: Aug. 14, 2000

(51) Int. Cl.$^7$ .................................................. B65D 7/00
(52) U.S. Cl. ....................................... 220/559; 220/578
(58) Field of Search ............................... 220/578, 559

(56) References Cited

U.S. PATENT DOCUMENTS

| | | | | |
|---|---|---|---|---|
| 593,333 A | * | 11/1897 | Park | 220/578 X |
| 1,284,751 A | * | 11/1918 | Mussino | 220/578 X |
| 2,211,486 A | * | 8/1940 | Zoia | 220/578 X |
| 2,252,115 A | * | 8/1941 | Brue | 220/578 X |
| 3,169,654 A | * | 2/1965 | Pollklesener | 220/578 X |
| 3,273,608 A | * | 9/1966 | Frankenberg | 220/578 X |
| 3,416,692 A | * | 12/1968 | Cline et al. | 220/578 X |
| 3,463,363 A | | 8/1969 | Zelna | 222/334 |
| 4,942,998 A | | 7/1990 | Horvath et al. | 228/102 |
| 5,760,360 A | | 6/1998 | Richardson, Jr. et al. | 219/50 |
| 5,794,813 A | * | 8/1998 | Lin | 220/578 X |

FOREIGN PATENT DOCUMENTS

EP 0 589 802 3/1994 ............ B23K/3/06

* cited by examiner

Primary Examiner—Steven Pollard
(74) Attorney, Agent, or Firm—Mintz, Levin, Cohn, Ferris, Glovsky and Popeo, P.C.

(57) ABSTRACT

A container device with an adjustable volume is provided for holding and immobilizing solder spheres used in manufacturing printed circuit boards and other electronic assemblies. The container device includes a hollow containing portion having a first terminal end and a second terminal end with a side wall connecting the first and second terminal ends and a removable sealing mechanism connected to the first terminal end. An adjustable piston is positioned within the containing portion having a length and a width such that when the piston is inserted into the containing portion of the container device, the piston exerts a sufficient pressure against the side wall of the containing portion to rigidly position the piston within the container device. The pressure exerted by the piston forms a seal between the piston and the side wall of the containing portion, thereby preventing solder spheres contained therein from slipping between the piston and the side wall. The piston is positioned within the containing portion at an adjustable and appropriate position such that the piston substantially fills any empty volume of the containing portion and presses substantially against a mass of solder spheres to immobilize solder spheres during transport and storage. The invention also provides a method of immobilizing solder spheres during transport and storage.

25 Claims, 4 Drawing Sheets

CONTAINER DEVICE WITH ADJUSTABLE VOLUME FOR IMMOBILIZING SOLDER SPHERES AND METHOD THEREOF

FIELD OF THE INVENTION

The invention provides a container device for containing and immobilizing articles and workpieces susceptible to mechanical and frictional damage during transport and storage. More particularly, the invention provides a container device with an adjustable volume to hold and immobilize solder spheres used in manufacturing printed circuit boards and other electronic assemblies. The invention also provides a method of immobilizing solder spheres.

BACKGROUND OF THE INVENTION

Ball grid array (BGA) packages have become the means of choice to house and mount electronic components to larger printed circuit boards and other electronic assemblies. BGA packages typically include a plastic, ceramic or laminated substrate having a specific pattern of pads or recesses on an exposed surface which serve as contact points for mechanically and electrically connecting electronic components, such as integrated circuit chips, to circuit paths of printed circuit boards. BGA packages are mounted to printed circuit boards by surface mount technologies (SMT), including, for example, a process known as reflow soldering. Reflow soldering involves loading solder alloy spheres onto pads or recesses of BGAs and then coupling solder spheres to solder paste applied to specific areas on printed circuit boards which correspond to the array of pads or recesses of BGAs. High temperatures during reflow soldering melt spheres and cause solder to flow around contact points forming mechanical and electrical solder joints between BGAs and printed circuit boards. Accurate placement of solder alloy spheres onto arrays of pads or recesses is, therefore, a critical step in achieving satisfactory mechanical connections and electrical interconnections between integrated circuits housed within BGAs and printed circuit boards.

Automated handling systems, often referred to as pick-and-place systems, are used to load solder alloy spheres to particular soldering sites (pads or recesses) on BGAs. To confirm placement of solder alloy spheres, which can be as small as 0.004 inch in diameter, an automated vision system is often employed to determine if spheres are present at appropriate soldering sites prior to the inception of reflow soldering. An automated vision system rapidly scans an area of loaded solder pads with a high resolution camera. The high resolution camera digitizes the visual data collected to produce a gray level histogram which distinguishes the presence or absence of individual solder spheres by contrasting the bright and shiny surfaces of solder spheres with a darker, more matte background. Such a contrast between the shine of the solder sphere surfaces and the dark background establishes a pass-fail criterion that is used to determine whether a solder sphere is present at a particular site or not. A solder sphere which does not possess sufficient brightness and shine may cause the automated vision system to determine a false fail, indicating that a solder sphere is not present at a particular site, although a solder sphere has, in fact, been accurately placed at the site. The automated vision system may then indicate to an assembling system that a solder sphere is missing, whereby the assembling system may automatically reject the circuit board in question or discontinue production. For such reasons, assemblers and manufacturers of electronic components and systems prefer solder alloy spheres with bright, shiny surfaces in order to avoid erroneous rejection of electronic components and unnecessary production downtime.

It is well known that solder alloy spheres are subject to surface oxidation after manufacture due to an inherent propensity of base metals used in surface alloys, such as tin and lead, to oxidize, causing surfaces of solder spheres to darken. Of particular concern to suppliers of solder spheres is surface darkening produced during transport and storage of solder spheres due to mechanical surface damage, referred to as surface fret corrosion, which exacerbates oxidation. Surface fret corrosion primarily occurs when surfaces of solder spheres rub against each other causing portions of sphere surfaces to be removed or chipped away. Conventional glass or plastic containers are typically filled with solder spheres by mass, rather than volume, which tends to produce an empty or dead space between a bottom surface of a container lid and solder spheres contained therein. The empty space enables solder spheres to tumble about the container and to rub against each other, as well as against the side walls of the container, when the container is agitated during transport and storage. Surface fret corrosion is caused by a phenomenon called "slip-stick", whereby mechanical and frictional energy is produced between rubbing sphere surfaces, causing surfaces to bind up rather than slip past each other. Agitation during transport of the container causes bound surfaces of spheres to suddenly release, chipping away portions of surface alloy. An accumulated loss of surface alloy by surface fret corrosion causes solder spheres to oxidize and darken.

Prior art packaging and containers which include provisions to prevent mechanical damage to articles contained therein, do not include packaging or containers which immobilize solder alloy spheres. Prior art containers are often designed for specific articles and workpieces. U.S. Pat. No. 5,709,301 discloses a storage container having a foam insert disposed in a container lid to hold and store paint brushes and paint rollers. U.S. Pat. No. 4,347,929 discloses a container for storing and transporting explosives having a foam insert attached to a lid with cut-outs to accommodate blasting caps. In more analogous art, U.S. Pat. No. 4,426,675 discloses a carrier box for storing and transporting printed circuit boards which includes strips of electrically-conductive foam material on the bottom and sides of the container to reduce vibration of printed circuit boards during transport.

Therefore, a method of immobilizing solder spheres and a container device for transporting and storing small solder alloy spheres that includes provisions to immobilize solder spheres is desirable to prevent mechanical surface damage and to eliminate surface oxidation of solder spheres.

SUMMARY OF THE INVENTION

The invention provides a container device for holding and immobilizing solder spheres used in manufacturing printed circuit boards and other electronic assemblies. The container device includes a hollow containing portion with a first terminal end and a second terminal end with at least one side wall connecting the first terminal end with the second terminal end; a removable sealing mechanism connected to the first terminal end; a piston positioned within the containing portion having a length and a width and of substantially similar shape as the containing portion; and an adjustment mechanism coupled to the piston for adjusting the position of the piston between the first and second terminal ends of the containing portion.

In a first embodiment of the invention, the containing portion and the piston are circular cylinders. The piston is of a sufficient width such that when inserted into the containing portion, the length of the piston presses substantially adjacent to the side wall of the containing portion to rigidly position the piston and to form a seal between the piston and the side wall of the containing portion. In another embodiment, the piston further includes a ridge connected to and surrounding the width of the piston. The ridge is of a sufficient height to exert a pressure of about 1 to about 5 pounds per square inch against the side wall of the containing portion to rigidly position the piston and to form a seal between the piston and the side wall. The ridge is angled at about 45 degrees toward the second terminal end of the containing portion. The angle of the ridge limits movement of the piston toward the first terminal end of the containing portion, thereby preventing movement of the piston toward the second terminal end and preventing removal of the piston from the containing portion once inserted. The piston further includes a centrally-positioned aperture extending the length of the piston to discharge air from the containing portion displaced by the piston when the piston is inserted into and adjusted within the containing portion.

In another embodiment of the invention, the piston further includes a layer of foam connected to a terminal end of the piston in facing relation to the first terminal end of the containing portion. The layer of foam has a sufficient width to exert a linear compression pressure of about 0.5 percent to about 5 percent against the side wall of the containing portion and a mass of solder spheres contained therein. The thickness of the layer of foam is about 0.10 cm to about 1.0 cm. The layer of foam is constructed of an elastomeric closed-cell foam that may be electrostatically dissipative to prevent solder spheres from adhering to the layer of foam. The piston is constructed of a compressible polymeric foam such as, although not limited to, polypropylene, polyethylene, neoprene, polyurethane, polystyrene, polysulfones and polyhalogenated polymers.

The adjustment mechanism includes a rod-shaped mandrel either permanently or removably coupled with the piston that adjusts a position of the piston within the container device upon application of pressure to the mandrel.

The containing portion of the container device is constructed of a suitable material, such as, although not limited to, polypropylene, polyethylene, neoprene, polyurethane, polystyrene, polysulfones and polyhalogenated polymers.

In another embodiment of the invention, a method of immobilizing solder spheres is provided comprising steps of: providing a container device with a hollow containing portion having a first terminal end and a second terminal end with a side wall connecting the first and second terminal ends and a removable sealing mechanism connected to the first terminal end; a piston for insertion into the containing portion having a length and a width and a first and second terminal end, the width of the piston being substantially similar to a width of the containing portion such that the piston conforms to and presses substantially adjacent to the side of the containing portion when inserted into the container device; providing a rod-shaped mandrel coupled to the second terminal end of the piston for insertion of the piston into the containing portion and adjustment of a position of the piston; loading a mass of solder spheres into the container device; inserting the piston into the second terminal end of the containing portion by application of a sufficient pressure to the mandrel; adjusting the position of the piston toward the first terminal end of the containing portion by application of a sufficient pressure such that the piston substantially fills empty volume in the containing portion; and pressing the piston substantially adjacent to or against the mass of solder spheres by application of a sufficient pressure to the mandrel to immobilize solder spheres.

In a version of this embodiment, a further step includes providing a layer of compressible foam connected to the first terminal end of the piston in facing relation to the first terminal end of the containing portion such that the layer of foam exerts a linear compression pressure of about 0.5 percent to about 5 percent against the mass of solder spheres to immobilizing solder spheres.

In another version of this embodiment, a further step includes providing a circumferential ridge connected to and surrounding the piston such that the ridge exerts a pressure of about 1 to about 5 pounds per square inch against the side wall of the containing portion to rigidly position the piston and to form a seal between the side wall and the piston to prevent solder spheres from slipping between the side wall and the piston.

BRIEF DESCRIPTION OF THE DRAWINGS

For a better understanding of the invention, reference is made to the drawings which are incorporated herein by reference and in which.

DETAILED DESCRIPTION OF THE INVENTION

Illustrative embodiments of the invention described below provide a container device with an adjustable volume for containing and immobilizing solder alloy spheres to prevent mechanical and frictional damage to surfaces of solder alloy spheres during transport and storage. Those skilled in the art will appreciate, however, that the container device in accordance with the embodiments of the invention is not limited to transporting and storing solder alloy spheres, but, rather, may be used in other applications which require articles or workpieces contained therein to be immobilized to prevent mechanical and frictional damage.

Embodiments of the invention will be described below with. reference to FIGS. 1a–8 which are presented herein for the purpose of illustrating embodiments and are not intended to limit the scope of the invention.

Figure 1A:
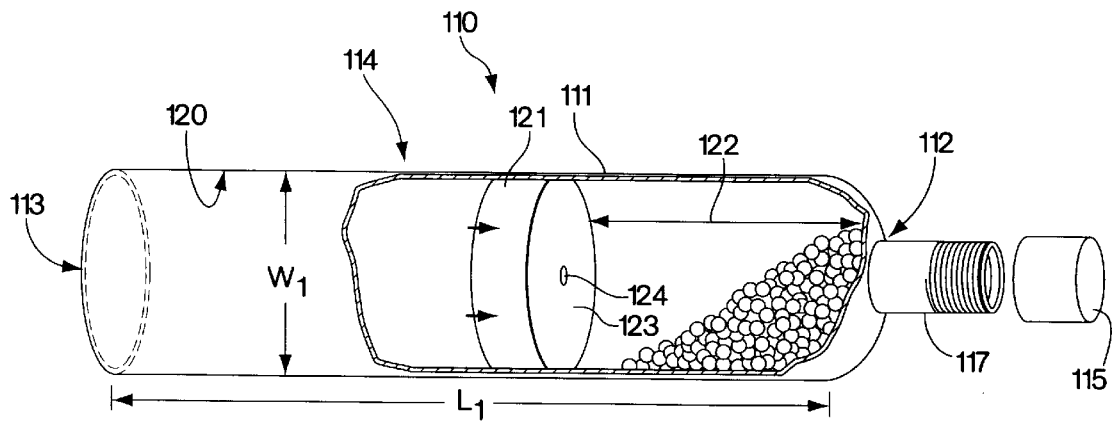
FIG. 1a illustrates a side view perspective of a container device according to a first embodiment of the invention.
Figure 1B:
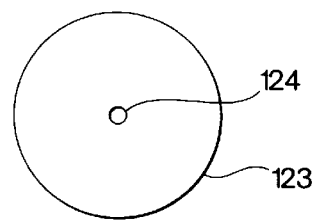
FIG. 1b illustrates a cross-sectional view of a piston of the first embodiment with a centrally-positioned through hole therein.

Referring to FIG. 1a, a first embodiment of the invention provides a container device 110 with an adjustable piston 123 contained therein. The container device 110 includes a hollow containing portion 111 having a first terminal end 112 and a second terminal end 113 with at least one side wall 114 connecting the first terminal end 112 with the second terminal end 113. The containing portion 111 has a length $L_1$ of about 5 cm to about 30 cm, and a width $W_1$ of about 3 cm to about 10 cm, although the invention is not limited to specific dimensions of the containing portion 111 and may include other dimensions suitable for containing and immobilizing solder alloy spheres. The cross-sectional geometry of the containing portion 111 may be a circular cylinder, as shown in FIG. 1b. However, the geometry of the containing portion 111 is not relevant to the invention and the containing portion 111 may be any shape or configuration suitable for containing and immobilizing solder alloy spheres. A suitable material of construction of the containing portion 111 includes, although is not limited to, polypropylene, polyethylene, neoprene, polyurethane, polystyrene, polysulfones and polyhalogenated polymers, such as polytetrafluoroethylene.

Referring to FIG. 1a, the container device 110 includes a removable end cap 115 attached to the first terminal end 112 of the containing portion 111. The end cap 115 may be a screw-type cap with threads disposed on an interior surface. A portion of the containing portion 111 at the first terminal end 112 includes a container device neck 117 that extends from the first terminal end 112. The container neck 117 has threads incorporated with an exterior surface that correspond to the threads disposed on the interior surface of the end cap 115. Upon attachment to the container device 110, the threads of the end cap 115 couple with the threads of the exterior surface of the container neck 117 to seal the container device 110. Alternatively, in another embodiment, the end cap 115 may be a flip-top type cap or other type of cap that is suitable for sealing the container device 110. The end cap 115 is constructed of a suitable material, such as, although not limited to, polypropylene, polyethylene, neoprene polyurethane, and polyhalogenated polymers, such as polytetrafluoroethylene.

Figure 2:
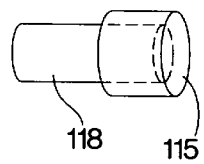
FIG. 2 illustrates a side view perspective of a sealing mechanism having a cap plug.
Figure 3:
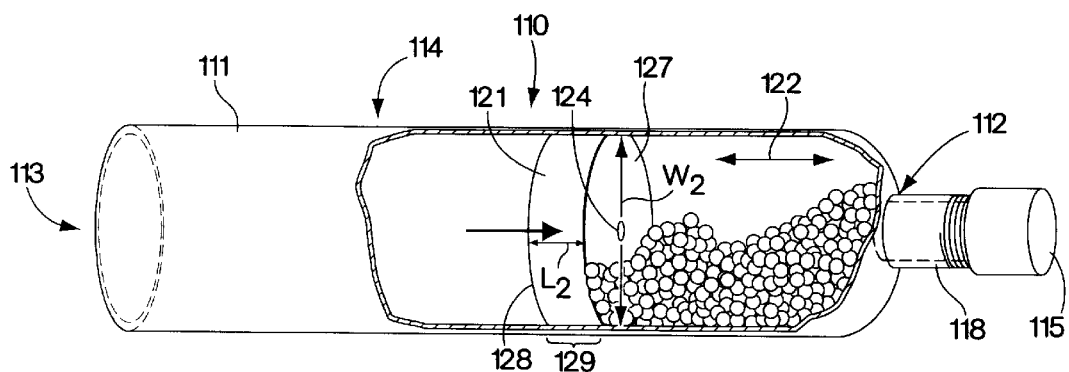
FIG. 3 illustrates a side view perspective of the piston positioned in the container device.

Referring to FIG. 2, in another version of the first embodiment, the end cap 115 may be fitted with a cap plug 118 which is connected to an underside surface of the end cap 115 and sized and shaped for insertion into the container neck 117. To connect the end cap 115 with the container neck 117, the cap plug 118 is inserted and compressed into the container neck 117. Referring to FIG. 3, upon insertion into the container neck 117, the cap plug 118 compresses and conforms to a shape of the container neck 117. The cap plug 118 helps to prevent movement of a mass of solder alloy spheres contained in the container device 110. The cap plug 118 is constructed of a suitable material, such as, although not limited to, a compressible polymeric foam including polypropylene, polyethylene, neoprene polyurethane, and polyhalogenated polymers, such as polytetrafluoroethylene. The compressible polymeric foam may be solids-loaded or chemically-treated to render the cap plug 118 electrostatically dissipative to help reduce or prevent electrostatic attraction and attachment of solder alloy spheres to the cap plug 118 when the cap plug 118 is inserted and removed from the container device 110.

Referring to FIG. 3, the piston 123 is structured and configured in a substantially similar geometry as the containing portion 111 with a first terminal end 127 and a second terminal end 128 and a body 129 connecting the first and second terminals ends 127, 128. The body 129 of the piston 123 has a length $L_2$ of about 1 cm to about 5 cm, depending upon size or volume of a dead or empty space 122 that remains in the container device 110 after the containing portion 111 is loaded with a mass of solder alloy spheres. As the container device 110 is filled with solder alloy spheres by mass rather than by volume, the dead or empty space 122 results after loading of solder alloy spheres.

The piston 123 has a width $W_2$ slightly narrower than the width $W_1$ of the containing portion 111 and is about 3 cm to about 10 cm. The width $W_2$ of the piston 123 is such that when the piston 123 is inserted into the container device 110, the piston 123 conforms to the shape of the containing portion 111. An outer surface 121 of the piston 123, extending the length $L_2$ of the piston body 129, presses substantially adjacent to the side wall 114 of the containing portion 111.

The piston 123 is constructed of a suitable material such as, although not limited to, a compressible polymeric foam including polypropylene, polyethylene, neoprene polyurethane, and polyhalogenated polymers, such as polytetrafluoroethylene. The compressible foam may be solids-loaded or chemically-treated in order the piston 123 may be electrostatically dissipative to help eliminate or prevent electrostatic attraction or attachment of solder alloy spheres to the piston 123 upon insertion and movement of the piston 123 in the container device 110.

The shape and the overall dimensions of the piston 123, as well as the compressible material with which the piston 123 is constructed, enable the piston 123 to conform to the shape of the containing portion 111 when inserted into the container device 110 and to substantially fill the empty space 122 that remains in the containing portion 111 after solder alloy spheres are loaded into the container device 110. In addition, these features of the piston 123 enable the outer surface 121 of the piston body 129 to press substantially adjacent to the side wall 114 of the containing portion 111 to rigidly position the piston 123. The piston 123 is held in position by tension created between the side wall 114 of the containing portion 111 and the outer surface 121 of the piston 123. Such tension also enables the piston 123 to form a seal with the side wall 114 that helps to reduce or prevent solder alloy spheres from slipping between the outer surface 121 of the piston 123 and the side wall 114 of the containing portion 111.

Referring to FIGS. 1a and 3-5, the piston 123 is inserted into the containing portion 111 through the second terminal end 113 of the container device 110. The position of the piston 123 within the containing portion 111 is adjusted by moving the piston 123 toward the first terminal end 112 of the container device 110. The position of the piston 123 is adjusted to help accommodate variations in the volume of the empty space 122 that result from containment of different masses of solder alloy spheres within the container device 110. The piston 123 is adjusted forward to an appropriate position in relation to the empty space 122 such that the piston 123 substantially fills the empty space 122. In addition, in the appropriate position, the piston 123 presses substantially adjacent to or against a mass of solder alloy spheres contained within the container device 110, thereby immobilizing the mass of solder alloy spheres in the container device 110.

Upon insertion into the container device 110, the piston 123 is initially adjusted to the appropriate position subsequent to loading the container device 110 with the mass of solder alloy spheres. Thereafter, as solder alloy spheres are dispensed from the container device 110 through the first terminal end, the position of the piston 123 is adjusted to maintain the piston 123 in the appropriate position, wherein the piston 123 substantially fills the empty space 122 and presses substantially adjacent to or against the mass of solder alloy spheres. The position of the piston 123 is adjusted by advancing the piston 123 toward the first terminal end 112 to accommodate the newly created empty space 122 and to immobilize the reduced mass of solder alloy spheres that result from dispensing of spheres from the container device 110.

Figure 4:
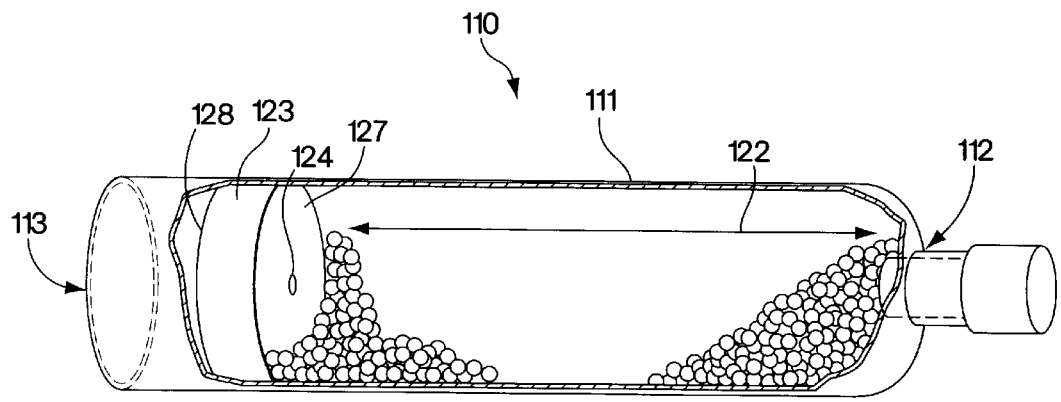
FIG. 4 illustrates a side view perspective of the piston positioned in the container device.

Referring to FIG. 4, the container device 110 contains a larger mass of solder alloy spheres than the mass of spheres shown in the container device 110 illustrated in FIGS. 1a and 3. Accordingly, the piston 123 is positioned substantially closer to the second terminal end 113 to help accommodate the larger mass of solder alloy spheres.

Figure 5:
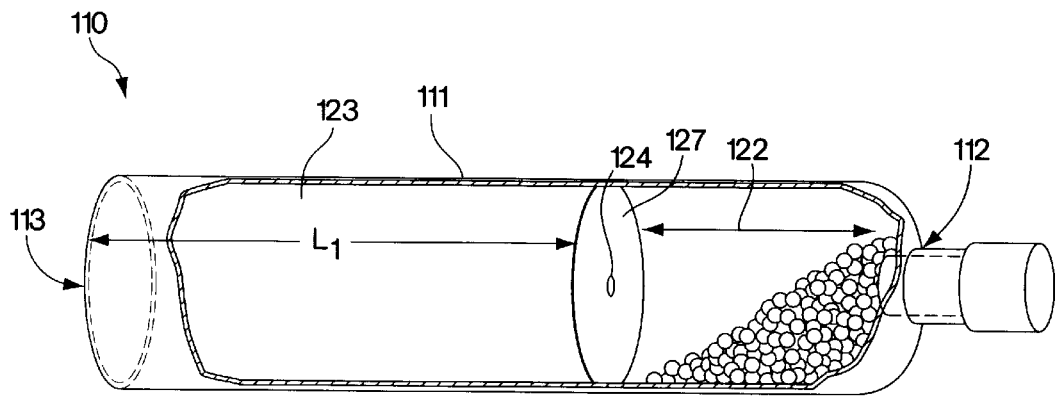
FIG. 5 illustrates a side view perspective of another version of the piston of the first embodiment.

Referring to FIG. 5, in another embodiment of the invention, the length $L_2$ of the piston body 129 may be increased, in addition to adjusting the position of the piston 123, to help accommodate variations in masses of solder alloy spheres contained within the container device 110. The increased length $L_2$ of the piston 123 enables the piston 123 to substantially fill the empty space 122 that results in the containing portion 111 from a small mass of solder alloy spheres and to press substantially adjacent to or against the mass of spheres.

Insertion of the piston 123 into the container device 110 and adjustment of the position of the piston 123 within the containing portion 111 is achieved by various mechanisms. For example, referring to FIG. 6, in the first embodiment a rod-shaped mandrel 130 is connected to the second terminal end 128 of the piston 123. Application of pressure to the mandrel 130 forces the piston 123 into the second terminal end 113 of the container device 110. Once inserted, the position of the piston 123 is further adjusted by application of pressure to the mandrel 130 to advance the piston 123 toward the first terminal end 112 of the container device 110. Pressure is applied to the mandrel 130 until the piston 123 is located at the appropriate position, wherein the piston substantially fills the empty space 122 and presses substantially adjacent to a mass of solder alloy spheres.

Figure 6:
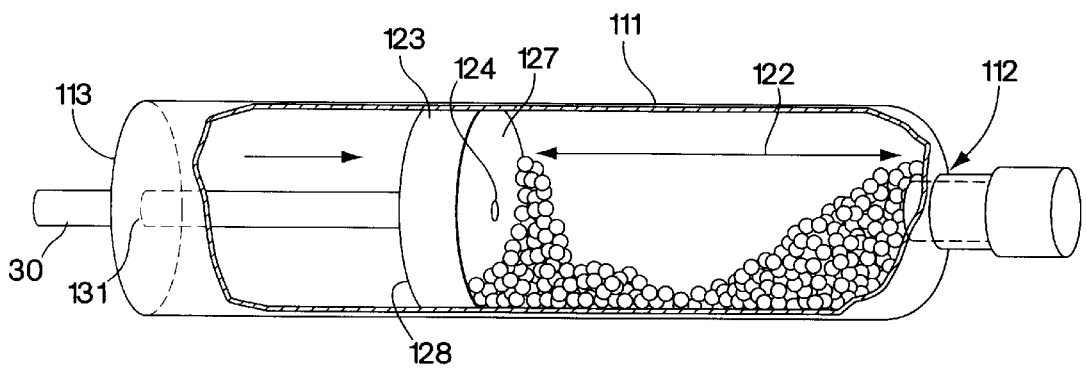
FIG. 6 illustrates a side view perspective of the container device with a rod-shaped mandrel inserted into the containing portion.

As shown in FIG. 6, the second terminal end 113 of the container device 110 of the first embodiment includes a centrally-positioned aperture 131 through which the mandrel 130 passes to the exterior of the container device 110. In another version of this embodiment, the second terminal end 113 may be open-ended to permit the mandrel 130 to be directly inserted into the containing portion 111 through the second terminal end 113. In still another version of this embodiment, the mandrel 130 may be disconnected from the piston 123 and inserted into either the centrally-positioned aperture 131 or the open-ended second terminal end 113 of the containing portion 111 when adjustment of the position of the piston 123 is desired.

In other embodiments, the second terminal end 113 may be structured and configured to accept other mechanisms for applying pressure to the piston 123 for insertion of the piston 123 into the container device 110 and adjustment of the position of the piston 123 within the containing portion 111 once inserted. For instance, in one embodiment, the second terminal end 113 may be structured and configured such that the piston 123 is inserted and its position adjusted by automated dispensing equipment used to load solder alloy spheres into ball grid arrays.

Referring to FIGS. 1a–1b and 3–6, the piston 123 also includes a centrally-positioned through hole 124 that extends through the length $L_2$ of the body 129 of the piston 123. The through hole 124 helps to discharge entrapped air from the empty space 122 as the piston 123 displaces entrapped air upon filling the empty space 122 within the containing portion 111. Entrapped air is forced into the through hole 124 at the first terminal end 127 of the piston 123 by negative pressure created from insertion of the piston 123 into the empty space 122. Entrapped air is subsequently discharged from the through hole 124 at the second terminal end 128 of the piston 123.

Figure 7:
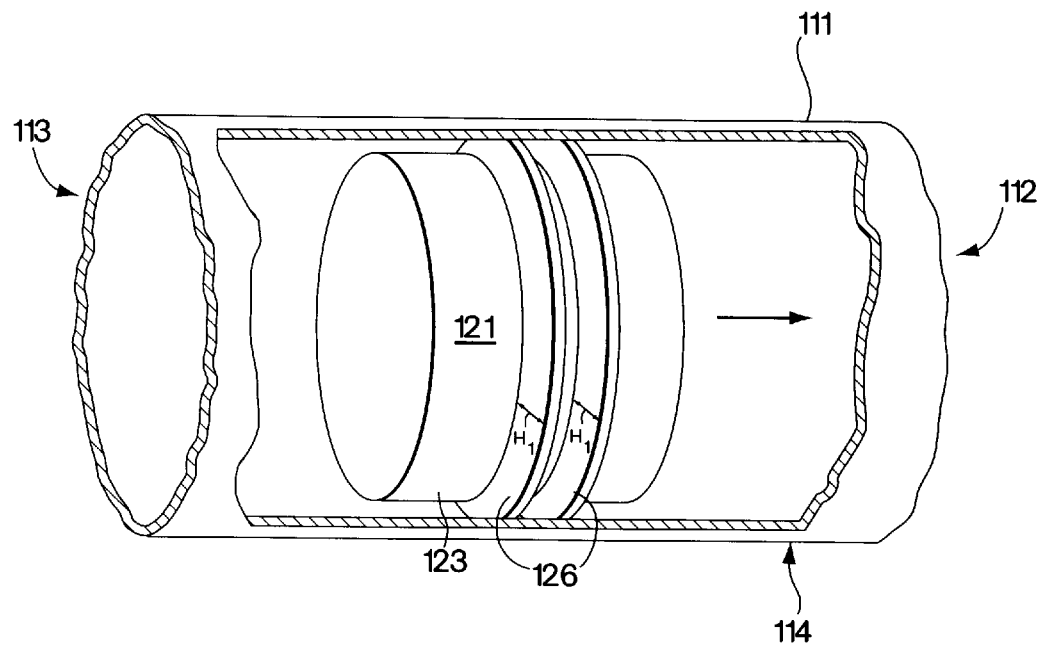
FIG. 7 illustrates a side view perspective of another embodiment of the piston with circumferential ridges.

Referring to FIG. 7, another embodiment of the invention includes at least one circumferential ridge 126 connected to and surrounding the outer surface 121 of the piston body 129. The circumferential ridge 126 is angled at about 45 degrees toward the second terminal end 113 of the container device 110. The height $H_1$ of the ridge 126 is about 0.125 cm to about 0.250 cm, depending upon the thickness and cross-section of the ridge 126. The angle and height $H_1$ of the ridge 126 allow the ridge 126 to compress against the side wall 114 of the containing portion 111, creating a pressure on the order of about 1 to about 5 pounds per square inch (psi). The pressure exerted by the ridge 126 against the side wall 114 of the containing portion 111 allows the piston 123 to be locked or rigidly positioned within the container device 110. Such pressure prevents the piston 123 from being dislodged from its position from agitation of the container device 110. The piston 123 remains locked or rigidly positioned at its position within the containing portion 111 until such time as a greater pressure is applied to the piston 123 to overcome the pressure exerted by the ridge 126 against the side wall 114 of the containing portion 111. For instance, application of a greater pressure to the mandrel 130 would overcome pressure exerted by the ridge 126 against the side wall 114 of the containing portion 111 and permit the position of the piston 123 to be adjusted. Although two ridges 126 are shown in the embodiment illustrated in FIG. 6, it is understood by those skilled in art that the piston 123 may have as many ridges connected to its outer surface 121 as are necessary to lock or rigidly position the piston 123.

Upon insertion of the piston 123 into the containing portion 111, the angle of the ridge 126 and the pressure exerted by the ridge 126 against the side wall 114 of the containing portion 111 create a wiping effect against the side wall 114 of the containing portion 111. The wiping effect helps to form a seal that prevents solder alloy spheres from slipping between the ridge 126 and the side wall 114 of the containing portion 111 and from leaking out of the container device 110 when the piston 123 is inserted or repositioned in the container device 110.

The ridge 126 allows the piston 123 to be advanced toward the first terminal end 112 of the container device 110 to substantially fill the empty space 122 created by dispensing solder alloy spheres from the first terminal end 112 of the container device 110, while preventing the piston 123 from moving backwards toward the second terminal end 113 of the container device 110. The ridge 126 also helps to lock or rigidly position the piston 123 in the appropriate position until a greater pressure than that exerted against the side wall 114 of the containing portion 111 is applied to the piston 123 to adjust the position the piston 123 toward the first terminal end 112 of the container device. In addition, the ridge 126 prevents the piston 123 from being removed entirely from the containing portion 111, once the piston 123 is inserted into the container device 110.

Figure 8:
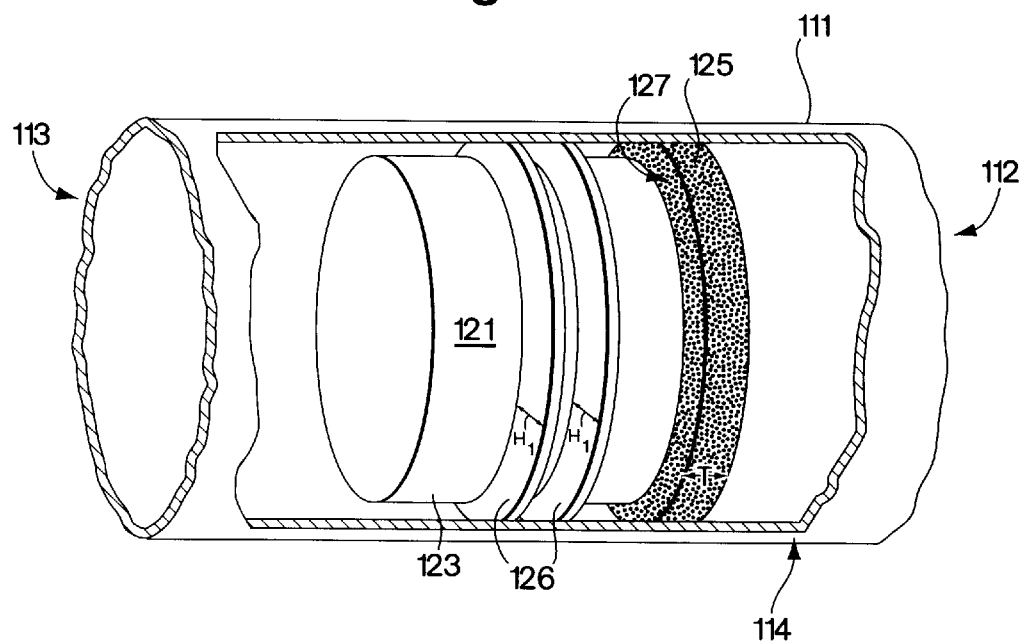
FIG. 8 illustrates a side view perspective of another embodiment of the piston with circumferential ridges and a layer of foam.

Referring to FIG. 8, another embodiment of the invention includes a layer of compressible foam 125 connected to the first terminal end 127 of the piston 123 in facing relation to the first terminal end 112 of the container device 110. The layer of compressible foam 125 is constructed of a suitable compressible foam, such as, but not limited to, an elastomeric closed-cell foam, with a thickness $T_1$ of from about 0.10 cm to about 1.0 cm. The thickness of the foam layer enables the foam layer 125 to exert a pressure against the side wall 114 of the containing portion 111 when the piston 123 is inserted due to a linear compression of the foam layer 125 on the order of about 0.5% to about 5%. The linear compression pressure exerted by the foam layer 125 against the side wall 114 creates a wiping effect upon insertion of the piston 123 into the containing portion 111 that, in effect, forms a seal. The seal prevents solder alloy spheres contained therein from slipping between the foam layer 125 and the side wall 114 of the containing portion 111, as well as from leaking from the container device 110 upon insertion of the piston into the containing portion 111. The foam layer 125 also exerts the linear compression pressure against the mass of solder alloy spheres contained in the containing portion 111 when the piston 123 is rigidly positioned substantially adjacent to the mass of spheres, thereby immobilizing solder spheres. Too great of a linear compression pressure would damage solder alloy spheres due to the excessive pressure, while too low of a linear compression pressure would allow solder alloy spheres to be jostled within the containing portion 111 during transport, causing surface damage to solder alloy spheres. Thus, the foam layer 125 provides further protection of solder alloys spheres against mechanical and frictional damage to surfaces of solder alloy spheres during transport and storage.

In another version of this embodiment, the foam layer 125 may be solids-loaded or chemically-treated to render the foam layer 125 electrostatically dissipative, preventing solder alloy spheres from being electrostatically attracted or attached to the foam layer 125 upon insertion and adjustment of the position of the piston 123 in the container device 110.

Figure 9:
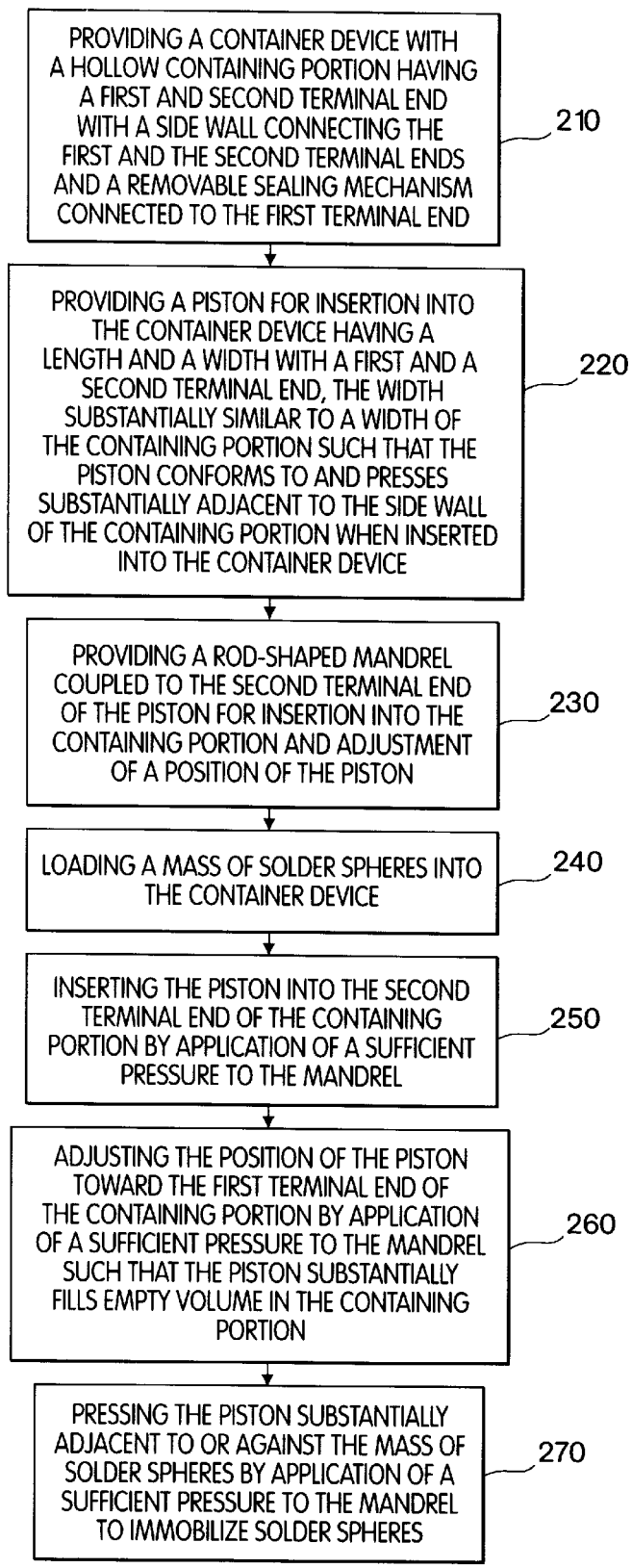
FIG. 9 illustrates a flow diagram of a method of the invention of immobilizing solder spheres.

In a further embodiment of the invention, a method is provided for immobilizing solder spheres. Referring to FIG. 9, the method of immobilizing solder spheres includes steps of providing a container device with a hollow containing portion having a first terminal end and a second terminal end with a side wall connecting the first and second terminal ends and a removable sealing mechanism connected to the first terminal end, as indicated by step 210; providing a piston for insertion into the container device having a length and a width with a first and a second terminal end, the width being substantially similar to a width of the containing portion such that the piston conforms to and presses substantially adjacent to the side wall of the containing portion when inserted into the container device, as indicated by step 220; providing a rod-shaped mandrel coupled to the second terminal end of the piston for insertion and adjustment of a position of the piston, as indicated by step 230; loading a mass of solder spheres into the container device, as indicated by step 240; inserting the piston into the second terminal end of the containing portion by application of a sufficient pressure to the mandrel, as indicated in step 250; adjusting the position of the piston toward the first terminal end of the containing portion by application of a sufficient pressure to the mandrel such that the piston substantially fills empty volume in the containing portion, as indicated by step 260; and pressing the piston substantially adjacent to or against the mass of solder spheres by application of a sufficient pressure to the mandrel to immobilize solder spheres.

In a version of this embodiment, a further step includes providing a layer of compressible foam connected to the first terminal end of the piston in facing relation to the first terminal end of the containing portion such that when the piston is pressed substantially adjacent to or against the mass of solder spheres, the layer of compressible foam exerts a linear compression pressure of about 0.5 percent to about 5 percent against the mass of solder spheres.

In another version of this embodiment, a further step includes providing at least one circumferential ridge connected to and surrounding the piston such that the ridge exerts a pressure of about 1 to about 5 pounds per square inch against the side wall of the containing portion to rigidly position the piston and to form a seal between the side wall and the piston.

Having thus described at least one illustrative embodiment of the invention, various alterations, modifications and improvements will readily occur to those skilled in the art. Such alterations, modifications and improvements are intended to be within the scope and spirit of the invention. Accordingly, the foregoing description is by way of example only and is not intended as limiting. The invention's limit is defined only in the following claims and the equivalents thereto.

Having thus described at least one illustrative embodiment of the invention, various alterations, modifications and improvements will readily occur to those skilled in the art. Such alterations, modifications and improvements are intended to be within the scope and spirit of the invention. Accordingly, the foregoing description is by way of example only and is not intended as limiting. The invention's limit is defined only in the following claims and the equivalents thereto.

What is claimed is:

1. A container device for holding and immobilizing solder spheres comprising:
   a hollow containing portion having a first terminal end and a second terminal end with at least one side wall connecting the first and second terminal ends;
   a removable sealing mechanism connected to the first terminal end;
   a compressible piston positioned within the containing portion having a length and a width wherein upon insertion of the compressible piston into the containing portion, the compressible piston conforms to a shape of an interior surface of the side wall; and
   an adjustment mechanism coupled to the piston for adjusting a position of the piston between the first and second terminal ends of the containing portion to immobilize solder spheres contained therein.

2. The container device of claim 1, wherein the containing portion is a circular cylinder.

3. The container device of claim 2, wherein the piston is a circular cylinder.

4. The container device of claim 1, wherein the width of the piston is sufficient to press the length of the piston substantially adjacent to the side wall of the containing portion and to rigidly position the piston within the containing portion.

5. The container device of claim 1, wherein the width of the piston is sufficient to press the length of the piston substantially adjacent to the side wall of the containing portion to form a seal between the piston and the side wall.

6. A container device for holding and immobilizing solder spheres comprising:
   a hollow containing portion having a first terminal end and a second terminal end with at least one side wall connecting the first and second terminal ends;

a removable sealing mechanism connected to the first terminal end;

a compressible piston positioned within the containing portion having a length and a width wherein upon insertion of the compressible piston into the containing portion, the compressible piston conforms to a shape of an interior surface of the side wall, the piston further includes at least one flexible circumferential ridge surrounding the width of the piston; and an adjustment mechanism coupled to the piston for adjusting a position of the piston between the first and second terminal ends of the containing portion to immobilize solder spheres contained therein.

7. The container device of claim 6, wherein the ridge is a sufficient height to exert a sufficient pressure against the side wall of the containing portion to form a seal between the ridge and the side wall of the containing portion.

8. The container device of claim 7, wherein the pressure exerted by the ridge is about 1 to about 5 pounds per square inch.

9. The container device of claim 7, wherein the height of the ridge is about 0.125 cm to about 0.250 cm.

10. The container device of claim 7, wherein the ridge is angled at about 45 degrees toward the second terminal end of the containing portion to limit movement of the piston toward the first terminal end.

11. The container device of claim 1, wherein the piston further includes a centrally-positioned through hole that extends the length of the piston to discharge air displaced by the piston when the piston is inserted into and adjusted within the containing portion.

12. A container device for holding and immobilizing solder spheres comprising:

a hollow containing portion having a first terminal end and a second terminal end with at least one side wall connecting the first and second terminal ends;

a removable sealing mechanism connected to the first terminal end;

a compressible piston positioned within the containing portion having a length and a width wherein upon insertion of the compressible piston into the containing portion, the compressible piston conforms to a shape of an interior surface of the side a wall, the piston further includes a layer of electrostatically-dissipative material connected to a terminal end of the compressible piston in facing relation to the first terminal end of the containing portion; and an adjustment mechanism coupled to the piston for adjusting a position of the piston between the first and second terminal ends of the containing portion to immobilize solder spheres contained therein.

13. The container device of claim 12, wherein the layer of electrostatically-dissipative material is constructed of an elastomeric closed-cell foam.

14. The container device of claim 12, wherein the layer of electrostatically-dissipative material exerts a linear compression pressure of about 0.5 percent to about 5 percent against the side wall of the containing portion and solder spheres contained therein when the piston is positioned substantially adjacent to or to against solder spheres.

15. The container device of claim 12, wherein the thickness of the layer of electrostatically-dissipative material is about 0.10 cm to about 1.0 cm.

16. The container device of claim 1, wherein the piston is constructed of a compressible foam.

17. The container device of claim 16, wherein the compressible foam is a polymeric foam selected from the group consisting of polypropylene, polyethylene, neoprene, polyurethane, polystyrene, polysulfones and polyhalogenated polymers.

18. The container device of claim 17, wherein the compressible foam is electrostatically dissipative.

19. The container device of claim 1, wherein the adjustment mechanism is a rod-shaped mandrel.

20. The container device of claim 1, wherein the adjustment mechanism is coupled to the piston for adjusting the position of the piston upon application of pressure to the adjustment mechanism.

21. The container device of claim 1, wherein the containing portion is constructed of a material selected from the group consisting of polypropylene, polyethylene, neoprene, polyurethane, polystyrene, polysulfones and polyhalogenated polymers.

22. A method for immobilizing solder spheres comprising steps of:

providing a container device including a hollow containing portion having a first terminal end and a second terminal end with a side wall connecting the first and second terminal ends and a removable sealing mechanism connected to the first terminal end;

providing a compressible piston for insertion into the second terminal end of the containing portion having a length and a width with a first and a second terminal end, the width being substantially similar to a width of the containing portion such that the piston conforms to and presses substantially against the side wall of the containing portion when inserted into the container device;

providing a rod-shaped mandrel coupled to the second terminal end of the piston;

loading a mass of solder spheres into the containing portion;

inserting the compressible piston into the second terminal end of the containing portion by application of a sufficient pressure to the mandrel;

adjusting a position of the compressible piston by application of a sufficient pressure to the mandrel such that the piston moves toward the first terminal end of the containing portion and substantially fills an empty volume; and pressing the compressible piston substantially adjacent to the mass of solder spheres by application of a sufficient pressure to the mandrel to immobilize the solder spheres.

23. The method of claim 22, including a further step of providing a layer of electrostatically-dissipative material connected to the first terminal end of the piston in facing relation to the first terminal end of the containing portion such that when the piston is pressed substantially adjacent to the mass of solder spheres, the layer of electrostatically-dissipative material exerts a linear compression pressure of about 0.5 percent to about 5 percent against the mass of solder spheres.

24. The method of claim 22, wherein the compressible piston includes at least one flexible circumferential ridge surrounding the width of the piston such that the flexible circumferential ridge exerts a pressure of about 1 to about 5 pounds per square inch against the side wall of the containing portion to rigidly position the piston and to form a seal between the side wall and the piston.

25. The container device of claim 1, wherein the compressible piston further includes a layer of electrostatically-dissipative material connected to a terminal end of the compressible piston in facing relation to the first terminal end of the containing portion.

* * * * *

UNITED STATES PATENT AND TRADEMARK OFFICE
CERTIFICATE OF CORRECTION

PATENT NO.    : 6,467,641 B1
DATED         : October 22, 2002
INVENTOR(S)   : Gerard R. Minogue It is certified that error appears in the above-identified patent and that said Letters Patent is hereby corrected as shown below:

Column 11,
Line 41, change "side a wall" to -- side wall --
Line 57, delete "or to against".

Column 12,
Lines 45-65, delete method claims 23 to 25 which were not included.

Signed and Sealed this

Twenty-fifth Day of March, 2003

JAMES E. ROGAN
*Director of the United States Patent and Trademark Office*